United States Patent
Gilet et al.

(10) Patent No.: US 8,937,297 B2
(45) Date of Patent: Jan. 20, 2015

(54) OPTOELECTRONIC DEVICE INCLUDING NANOWIRES WITH A CORE/SHELL STRUCTURE

(71) Applicants: Philippe Gilet, Teche (FR); Ann-Laure Bavencove, Moustajon (FR)

(72) Inventors: Philippe Gilet, Teche (FR); Ann-Laure Bavencove, Moustajon (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/692,096

(22) Filed: Dec. 3, 2012

(65) Prior Publication Data
US 2013/0140521 A1    Jun. 6, 2013

Related U.S. Application Data

(60) Provisional application No. 61/566,071, filed on Dec. 2, 2011.

(51) Int. Cl.
| | |
|---|---|
| *H01L 33/06* | (2010.01) |
| *H01L 33/04* | (2010.01) |
| *B82Y 20/00* | (2011.01) |
| *H01L 33/24* | (2010.01) |
| *B82Y 99/00* | (2011.01) |

(52) U.S. Cl.
CPC ............. *H01L 33/04* (2013.01); *Y10S 977/762* (2013.01); *B82Y 20/00* (2013.01); *H01L 33/24* (2013.01); *B82Y 99/00* (2013.01); *H01L 33/06* (2013.01)
USPC ................... 257/14; 257/12; 257/13; 257/79; 257/94; 977/762

(58) Field of Classification Search
USPC ......... 257/12–15, 79–103; 977/762, 825, 949
See application file for complete search history.

(56) References Cited

U.S. PATENT DOCUMENTS

| | | |
|---|---|---|
| 7,045,375 B1 | 5/2006 | Wu et al. |
| 7,521,274 B2 | 4/2009 | Hersee et al. |
| 7,829,445 B2 | 11/2010 | Kim et al. |
| 2003/0107047 A1 | 6/2003 | Okuyama et al. |
| 2005/0208302 A1 | 9/2005 | Yi et al. |
| 2005/0253138 A1 | 11/2005 | Choi et al. |
| 2011/0204327 A1* | 8/2011 | Hiruma et al. .................. 257/13 |

FOREIGN PATENT DOCUMENTS

| | | |
|---|---|---|
| DE | 10 2010 01271 | 9/2011 |
| EP | 2 254 164 | 11/2010 |
| EP | 2 357 676 | 8/2011 |
| WO | 2009/087319 | 7/2009 |

* cited by examiner

*Primary Examiner* — Matthew W Such
*Assistant Examiner* — Scott Stowe
(74) *Attorney, Agent, or Firm* — Clark & Brody

(57) ABSTRACT

Optoelectronic device including light-emitting means in the form of nanowires (2, 3) having a core/shell-type structure and produced on a substrate (11), in which said nanowires comprise an active zone (22, 32) including at least two types of quantum wells associated with different emission wavelengths and distributed among at least two different regions (220, 221; 320, 321) of said active zone, in which the device also includes a first electrical contact zone (15) on the substrate and a second electrical contact zone (16) on the emitting means, in which said second zone is arranged so that, as the emitting means are distributed according to at least two groups, the electrical contact is achieved for each of said at least two groups at a different region of the active zone, and the electrical power supply is controlled so as to obtain the emission of a multi-wavelength light.

10 Claims, 6 Drawing Sheets

Figure 1:
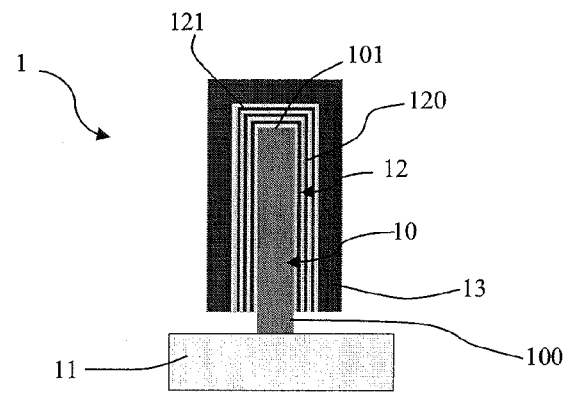

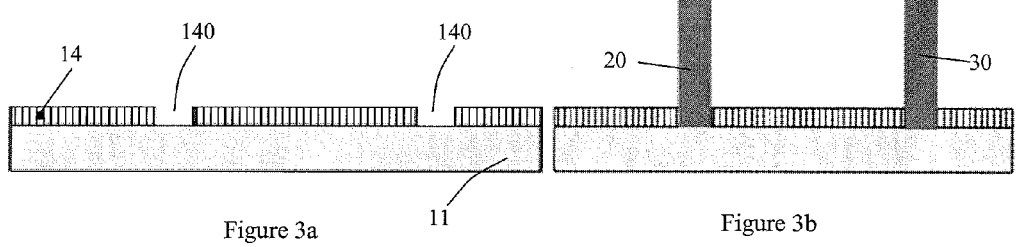
Figure 3a
Figure 3b
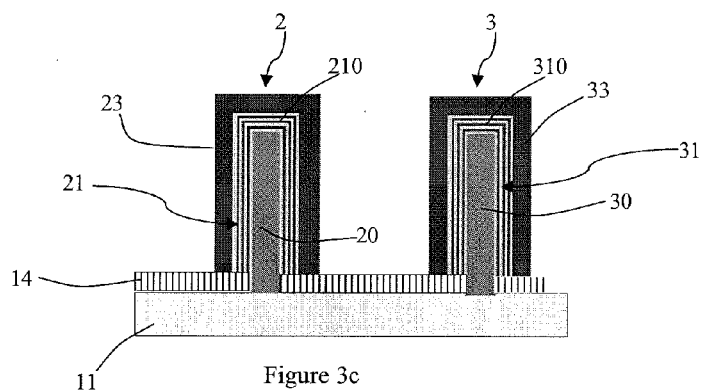
Figure 3c
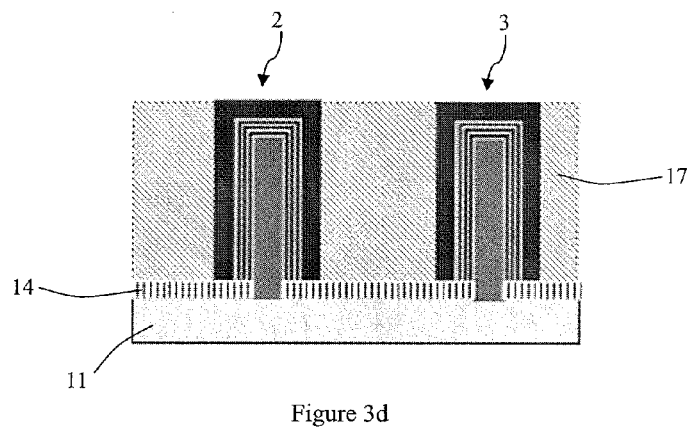
Figure 3d

OPTOELECTRONIC DEVICE INCLUDING NANOWIRES WITH A CORE/SHELL STRUCTURE

This application claims priority under 35 USC §119(e) based on U.S. Provisional No. 61/566,071 filed on Dec. 2, 2011, which is incorporated in its entirety herein.

The invention relates to the field of optoelectronics and, in particular, light emitters based on nanowires having a core/shell-type structure.

Indeed, it is known to produce optoelectronic devices and in particular light-emitting diodes (LED) based on InGaN/GaN nanowires.

In general, nanowires can have two different structures, an axial structure or a radial structure.

In both cases, the nanowire comprises an n-doped zone, a p-doped zone and, between these two zones, an unintentionally doped active zone that comprises quantum wells.

The use of InGaN to form quantum wells is known in the prior art. By increasing the Indium concentration, it is possible to reduce the gap of this ternary material from the gap of GaN, of which the value is around 3.5 eV, to the gap of InN, of which the value is around 0.69 eV. It is thus theoretically possible to scan the entire visible spectrum.

In a nanowire with an axial structure, the active zone is oriented parallel to the nanowire growth substrate. In a nanowire with a radial structure, the active zone is epitaxially grown around the nanowire obtained from the growth substrate.

The radial structure obtained is said to be a core/shell structure. The term "nanowire" will also be used to refer to the complete structure, including the core, the axial active zone and the shell.

Nanowires with an axial structure are generally obtained by molecular beam epitaxy (MBE), whereas nanowires with a radial structure are deposited by metalorganic chemical vapor deposition (MOCVD).

Many documents describe methods enabling nanowires with a radial active zone to be obtained.

It is possible in particular to cite document U.S. Pat. No. 7,521,274, which describes a so-called pulsed growth method, or document U.S. Pat. No. 7,829,445, which describes an ammonia flow growth method.

Nanowires with a radial structure have a number of advantages over nanowires with an axial structure.

It is possible in particular to cite an increase, with respect to the same substrate surface, in the junction surface and the active zone volume, as well as a limitation of surface recombinations and therefore an increase in the electroluminescence yield.

In addition, the electrical connection of nanowires with a radial structure is generally performed according to a parallel configuration. Thus, an upper electrode enables carriers to be injected into the shell of the nanowires, while a lower electrode ensures the connection of the core of the nanowire. The difference in potential is then the same at the terminals of each nanowire.

The parallel connection diagrams are dependent on the properties of the core, the shell and the substrate used.

It is possible in particular to cite document WO 2009/087319, which describes a diagram in which the upper electrode surrounds the upper portion of the nanowires while leaving their upper face exposed. Document US 2005/0253138 describes an upper electrode that completely surrounds the upper portion of the nanowires.

In general, to ensure lighting, it is desirable to have effective systems emitting white light. However, light-emitting diodes are monochromatic.

Various solutions have therefore been proposed in the prior art in order to generate white light, based on monochromatic LEDs.

For white LEDs obtained by conventional planar technology, a first solution consists of combining a diode emitting a short wavelength $\lambda 1$, coming, for example, from a blue LED, with a luminophore emitting in a long complementary wavelength $\lambda 2$. The luminophore consists, for example, of YAG:Ce-type phosphor emitting primarily in the yellow range.

The color of the light perceived by the human eye (more or less pronounced white) comes from the combination of the two wavelengths $\lambda 1$ and $\lambda 2$.

However, losses in efficacy associated with the phosphor conversion efficiency are significant and the quality of the emission is difficult to control.

For these planar LEDs, a second solution consists of using at least three LEDs emitting different visible wavelengths that combine to give a white light.

In practice, an LED emitting a blue light is associated with an LED emitting a green light and with an LED emitting a red light. These LEDs are made of different materials.

The absence of luminophore and therefore of phosphor makes it possible to overcome losses due to phosphor. However, in practice, the color rendering index and the color temperature (corresponding to the temperature of the black body emitting the same light spectrum) are dependent on the proportion of each of the components of colored light. However, this proportion is difficult to control in a device, as each of the LEDs has a different electrical behavior under electrical injection (wavelength offset, aging, etc.).

In addition, it is necessary to associate monochromatic diodes having an external quantum efficacy greater than 50% for the three colors.

However, planar technology does not make it possible to obtain this performance, in particular in the green-yellow spectral region in which the external quantum efficacy of the devices falls by about 10%.

With regard to LEDs based on nanowires, two main solutions have been proposed in the prior art for generating white light.

The first solution consists of conventionally associating phosphor with a nanowire-based structure.

It is possible, for example, to cite the document US 2005/0208302, which describes a heterogeneous structure including a nanowire and a phosphor layer over the end or over the complete surface of the nanowire.

This heterogeneous structure has the same disadvantages as a structure comprising a planar LED and a luminophore.

Another solution consists of not using phosphor and of proposing very specific structures.

Thus, document U.S. Pat. No. 7,045,375 describes a white light emitting system, in which a planar LED structure and nanowire LED structures emitting different wavelengths are associated.

This structure also has disadvantages associated with the use of different materials of which the electrical behavior may vary.

It is also possible to cite document EP 2 254 164, which describes a device in which nanowires of different heights and emitting different wavelengths are associated. It is noted that, in such a device, it is difficult to control the height of the nanowires.

Finally, in the devices described in the prior art, the nanowires used have an axial structure. There is therefore a loss in emitting surface with respect to a planar structure and therefore a loss in efficacy.

The invention is intended to overcome these disadvantages by proposing an optoelectronic device enabling the emission of a multi-wavelength light and in particular a white light with which the quality of the emission can easily be controlled.

Thus, the invention relates to an optoelectronic device including light-emitting means in the form of nanowires having a core/shell-type structure and obtained on a substrate, in which said nanowires comprise an active zone including at least two types of quantum wells associated with different emission wavelengths and distributed among at least two different regions of said active zone, in which the device also includes a first electrical contact zone on the substrate and a second electrical contact zone on the emitting means, in which said second zone is arranged so that, as the emitting means are distributed according to at least two groups, the electrical contact is achieved for each of said at least two groups at a different region of the active zone, and the electrical power supply is controlled so as to obtain the emission of a multi-wavelength light.

This optoelectronic device avoids the use of phosphor and it is obtained from the same growth substrate, with all of the nanowires being made of the same material.

This makes it possible to eliminate the problems of different aging or different behavior according to temperature, which are encountered in the known devices.

In addition, the nanowires are obtained during the same epitaxis step, which saves time when producing the device, thereby resulting in a lower cost.

Finally, the color of the light emitted by the device according to the invention is directly dependent on the number of emitting means in each of the groups present.

In an example of an embodiment of the optoelectronic device according to the invention, a first region of the active zone of the nanowires is a peripheral portion at least partially surrounding the core of the nanowires and comprising radial quantum wells and a second region of this active zone is an upper portion located on the end of the core of the nanowire, with axial quantum wells.

In another example of an embodiment of the optoelectronic device according to the invention, the active zone comprises a third region, located between the first and second regions.

Advantageously, the optoelectronic device includes a plurality of portions electrically connected in parallel and inside of which the emitting means are connected in parallel, with the electrical contact of the second electrical contact zone being produced in a region different from the active zone, for two adjacent portions.

Preferably, when the active zone of the emitting means comprises two distinct regions, the emitting means of the second group are surrounded by an electrically insulating material, with the exception of the upper face opposite the substrate, and the second electrical contact zone completely surrounds the emitting means of the second group and is provided on the periphery of the emitting means of the first group and in direct contact with same, over a height h corresponding to the first region of the active zone, so that the upper portion of these emitting means is exposed.

When the emitting means comprise an active zone with a third region, the emitting means of a third group are surrounded by an electrically insulating material over the height h, and the second electrical contact zone is provided on the periphery of the emitting means of the third group, over a height $h_1$, greater than h, so that the upper portion of the emitting means is partially exposed.

In an alternative embodiment of the optoelectronic device according to the invention, for at least some of the emitting means, the second electrical contact zone is arranged so that the electrical contact is produced in at least two regions of the active zone.

In this alternative, the emitting means are distributed among at least two electrically independent groups, and the electrical power supply is controlled so that, for each of said at least two groups, different regions of the active zone are supplied with power.

Finally, the active zone of the nanowires is preferably made of InGaN/GaN.

Figure 2:
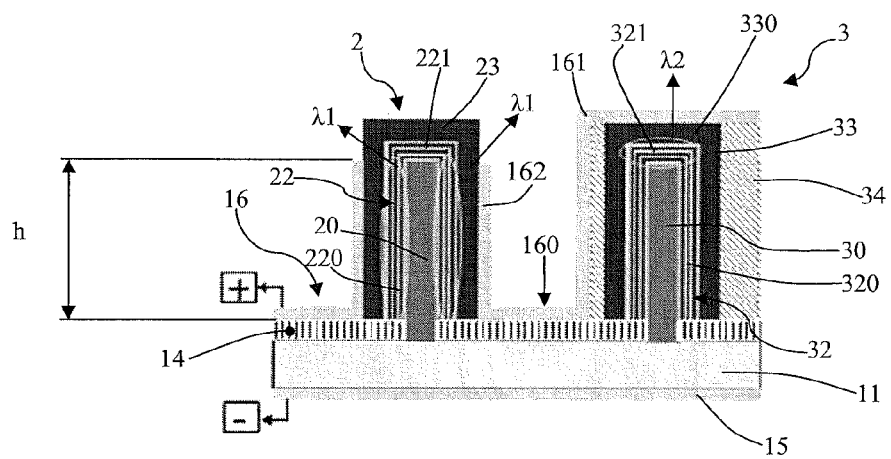
Figure 5:
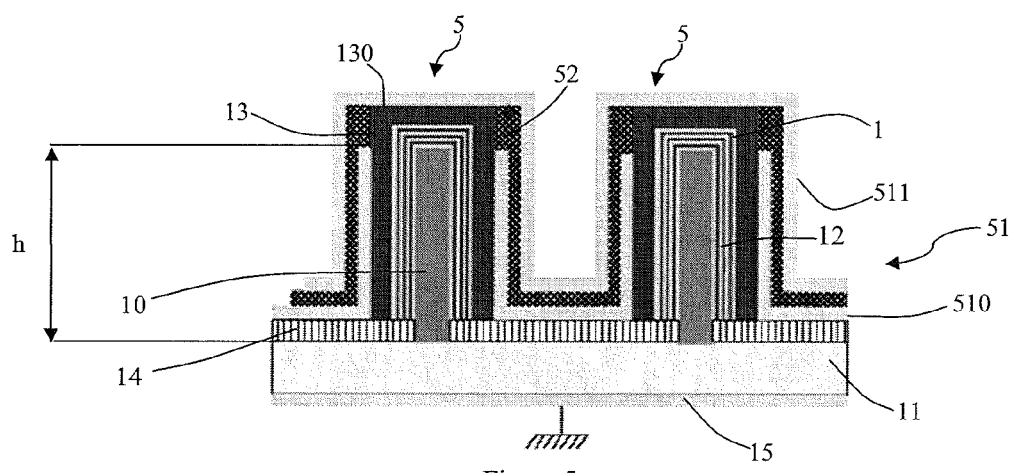
Figure 3E:
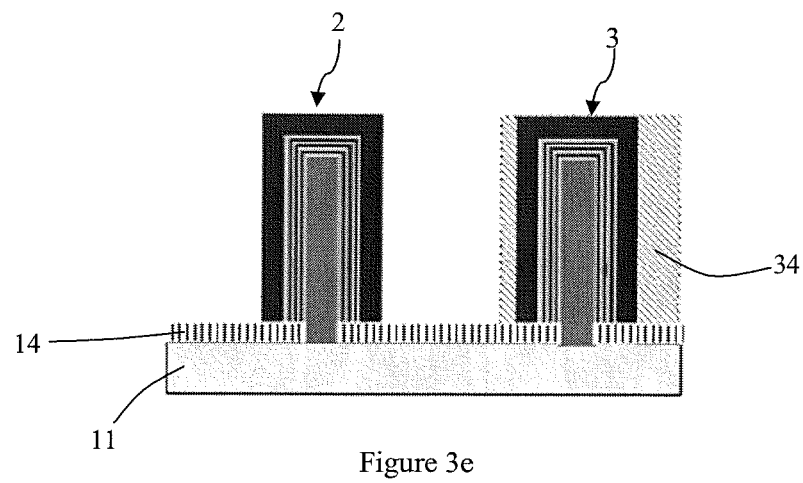
Figure 3F:
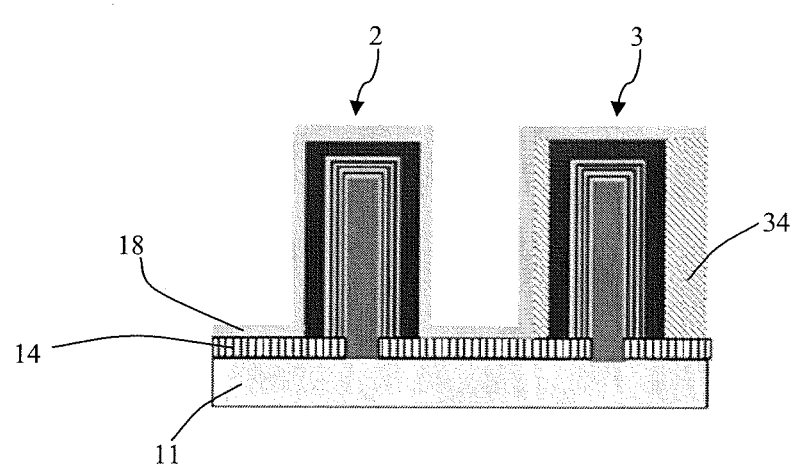
Figure 3G:
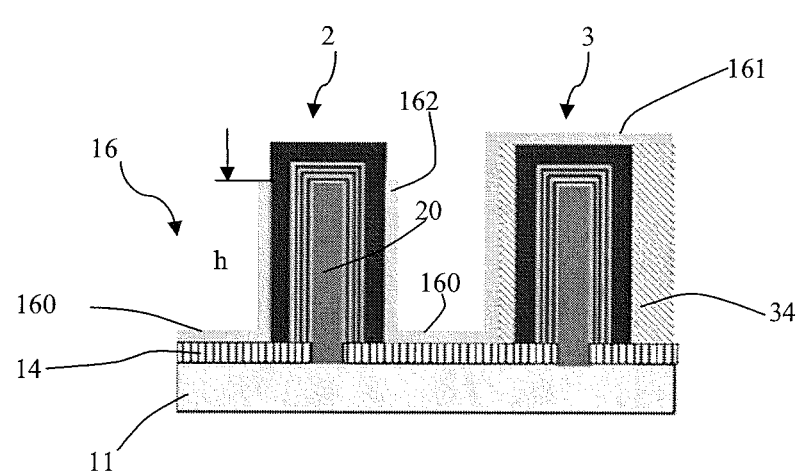
Figure 3H:
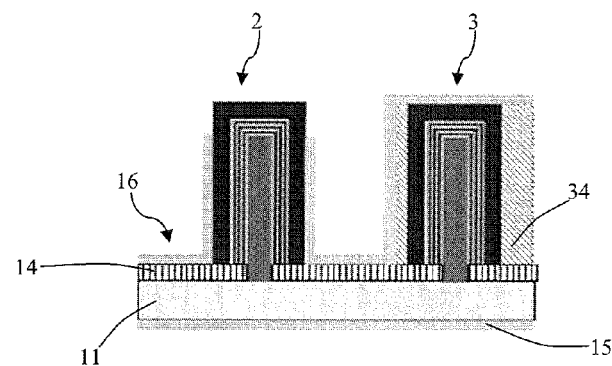
Figure 4:
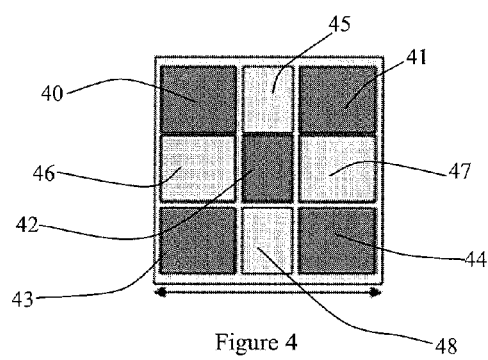
Figure 6:
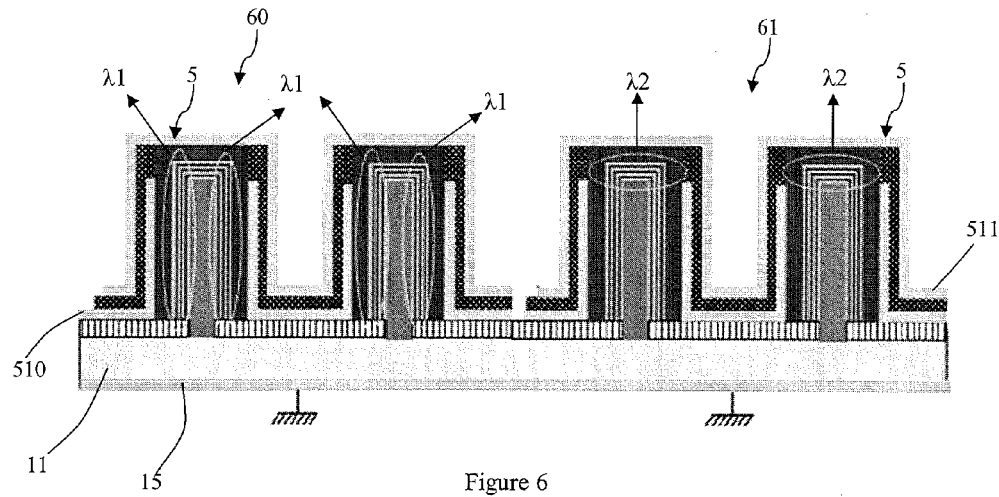
Figure 7:
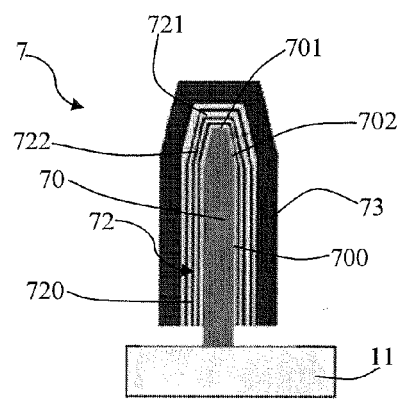
Figure 8:
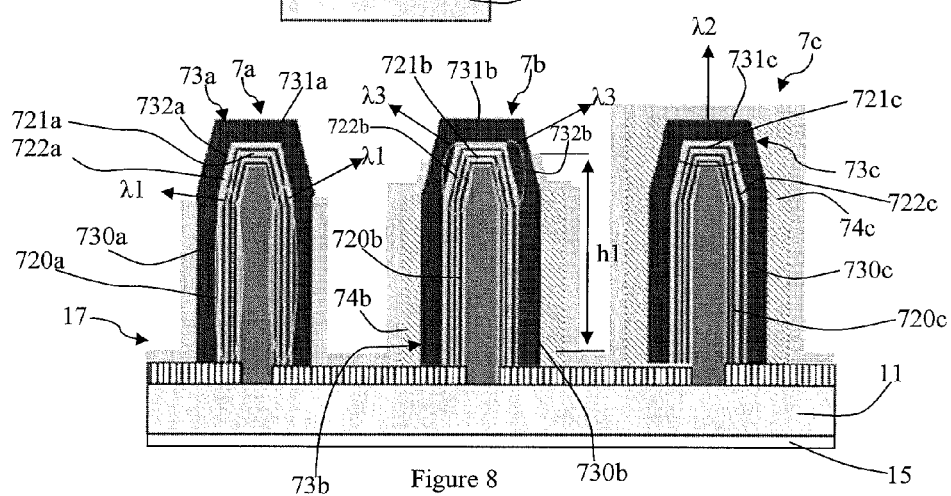
Figure 9:
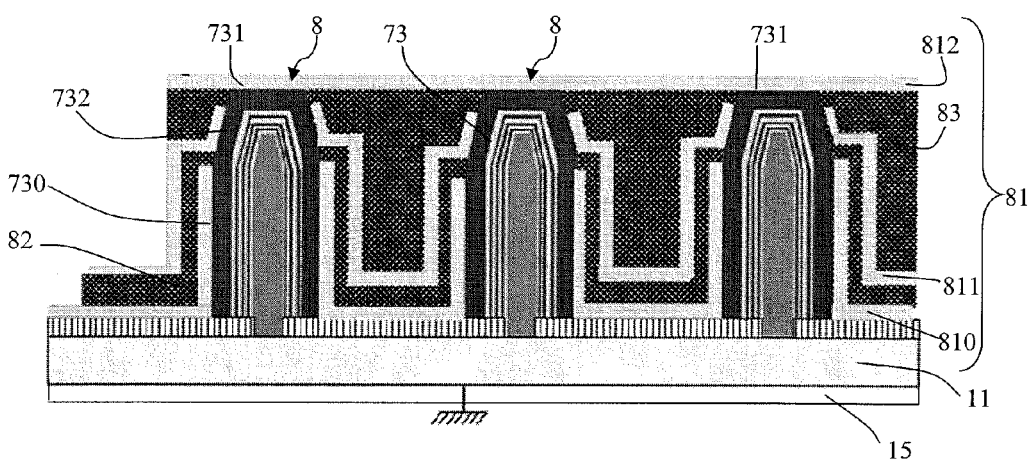
Figure 10:
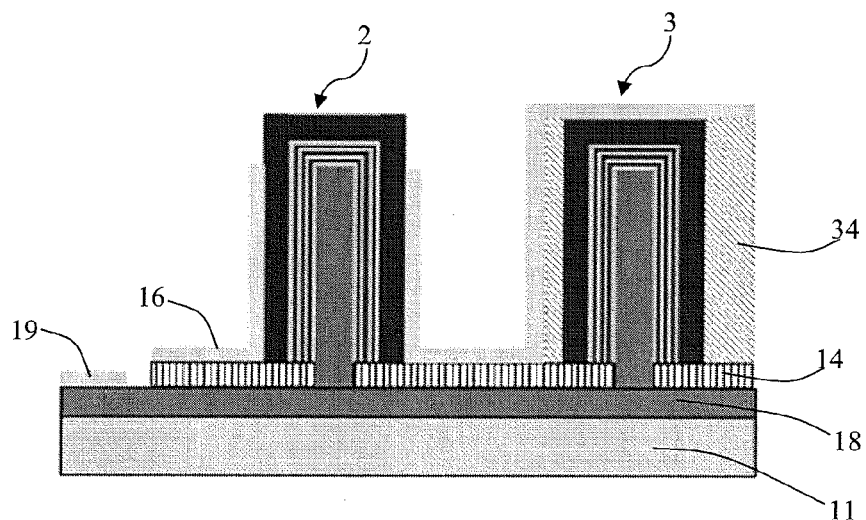
Figure 11:
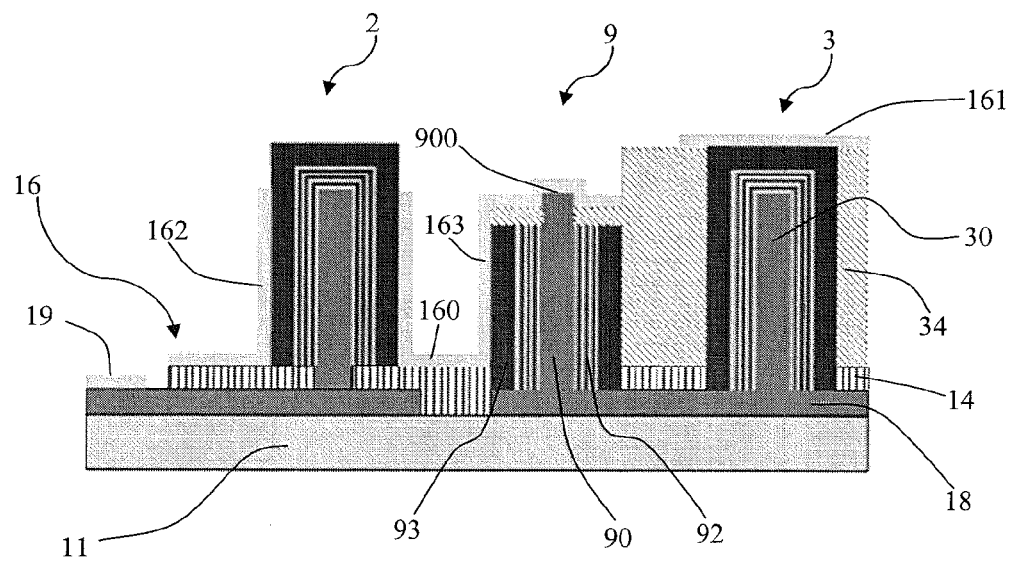

The invention can be better understood and other objectives, advantages and features of it will become more clear in the following description, which is provided with reference to the appended drawings, in which:

FIG. 1 is a cross-section view diagrammatically showing a nanowire having a core/shell-type structure, of which the active zone comprises two different regions, FIG. 2 is a diagrammatic cross-section view showing an optoelectronic device according to the invention, FIGS. 3a to 3h are cross-section views showing different steps of a method for producing the optoelectronic device shown in FIG. 2, FIG. 4 diagrammatically shows an example of an electrical connection of nanowires of an optoelectronic device according to the invention, FIG. 5 is an explanatory diagram of a first alternative embodiment of the optoelectronic device according to the invention, produced with nanowires as shown in FIG. 1, FIG. 6 shows an example of an embodiment of an optoelectronic device according to the invention, based on the alternative shown in FIG. 5, FIG. 7 is a diagrammatic cross-section view showing another example of a nanowire having a core/shell-type structure, in which the active zone comprises three different regions, FIG. 8 is a diagrammatic cross-section view of a second alternative embodiment of an optoelectronic device produced with nanowires as shown in FIG. 7, FIG. 9 shows an alternative embodiment of the optoelectronic device shown in FIG. 8, FIG. 10 shows another alternative of the optoelectronic device according to the invention concerning the substrate, and FIG. 11 shows yet another alternative of the optoelectronic device according to the invention, in which the emitting means are connected in series.

The common elements in the different figures will be denoted by the same reference signs.

FIG. 1 shows a nanowire 1 having a core/shell-type structure.

Throughout the description, the term "nanowire" will designate an elongate structure, i.e. a structure in which the height-to-diameter ratio (or the extension of the base width) is greater than 1.

The core 10 of the nanowire 1 consists of an actual nanowire, which has been obtained by epitaxis perpendicular to the growth substrate 11.

As an example, the substrate is made of strongly n-doped silicon and the core 10 is made of n-doped gallium nitride.

The core 10 therefore has two families of distinct crystalline planes: the m-planes over the periphery 100 of the core and the c-plane at the upper portion 101 of the core, opposite the substrate.

The active zone 12 of the nanowire is produced around the core 10. It consists of quantum wells arranged radially around the core and made of InGaN/GaN and which result from a growth in planes perpendicular to the c-plane, for example on en-planes.

It is possible to distinguish two families of quantum wells, according to the crystallographic plane on which they are epitaxially grown.

Thus, the active zone 12 of the nanowire 1 in this case comprises two regions, a first peripheral region 120, in which the quantum wells are radial and a second upper region 121 in which the quantum wells are axial.

It has already been established that these two families of wells have emission properties (wavelength and internal quantum efficacy) that are largely dependent on the presence of an internal piezoelectric field in the quantum wells.

Reference can thus be made to the article of Lai et al., "Excitation current dependent cathodoluminescence study of InGaN/GaN quantum wells grown on m-plane and c-plane GaN substrates", JAP 106 (2009) 113104.

In addition, the first studies of growth of quantum wells made of InGaN/GaN and having a radial structure appear to indicate that the growth mechanisms are dependent on crystallographic planes on which the wells are epitaxially grown.

Reference can be made to the article of Bergbauer W. et al, "Continuous-flux MOVPE growth of position-controlled N-face GaN nanorods and embedded InGaN quantum wells", Nanotechnology 21 (2010) 305201.

The inventors have thus started with the hypothesis that the rate of growth and the incorporation of indium are different on a c-plane or on an m-plane. This particularity leads to quantum wells with different thicknesses and/or compositions and therefore to the emission of different wavelengths.

The inventors experimentally studied, by low-temperature cathodoluminescence, the difference in emission between axial polar quantum wells and radial non-polar quantum wells on nanowire-type LED structures obtained by MOCVD, in which said nanowires have a core/shell-type structure with an active zone formed by InGaN/GaN quantum wells.

These experiments showed that the difference in emission wavelength between the two families of quantum wells was on the order of 32 nm to 10 K.

Thus, the inventors showed that it is possible to have nanowires with a core/shell-type structure having axial quantum wells and radial quantum wells associated with emission wavelengths located in very separate spectral ranges.

In general, it is thus possible to consider the two wavelengths corresponding to the two types of quantum wells not only to be different but for there to be no significant overlap between the two spectra emitted by these two types of quantum wells. In other words, the difference between the two wavelengths is at least equal to the half-sum of the widths of the spectra at mid-height.

Finally, the nanowire comprises a shell 13 that is produced around the active zone 12. The shell can be made of p-doped GaN.

FIG. 2 diagrammatically shows an optoelectronic device according to the invention. This optoelectronic device in this case comprises two light-emitting means, of the nanowire 1 type shown in FIG. 1. These emitting means 2 and 3 in this case comprise a similar structure. They are distinguished only by the structure of one of their electrical contact zones.

Of course, an optoelectronic device according to the invention will, in practice, comprise more than two emitting means.

The cores 20 and 30 of the emitting means 2 and 3 are constituted by an actual nanowire that has been epitaxially grown perpendicularly to the growth substrate 11, according to the insulating growth mask 14.

Each emitting means 2, 3 comprises an active zone 22, 32, which surrounds the core 20, 30, as well as a shell 23, 33.

Inside the active zone 22, 32, two regions corresponding to quantum wells associated with different emission wavelengths can be distinguished.

Thus, the peripheral region 220, 320 comprises radial quantum wells and the upper region 221, 321 of the active zone comprises axial quantum wells.

The axial quantum wells are characterized by a greater degree of relaxation of stresses than the radial wells. The inventors have therefore started with the hypothesis that it is theoretically possible to incorporate more indium in the axial quantum wells. This enables the axial quantum wells to generate photons of which the emission wavelength $\lambda 2$ is greater than the wavelength $\lambda 1$ of the photons generated by the radial quantum wells.

In addition, the inventors noted that the light emitted by the radial quantum wells in a core/shell-type structure is guided only slightly if at all by the wire-based geometry of the structure.

Thus, the photons of wavelength $\lambda 1$ leave the emitting means without reaching the axial quantum wells, which limits the photon resorption phenomena observed in conventional structures. The efficiency of the emitting means is therefore increased.

The optoelectronic device shown in FIG. 2 comprises two electrical contact zones.

A first electrical contact zone 15 is produced on the substrate, on the side opposite the emitting means 2 and 3.

A second electrical contact zone 16 is produced on the emitting means 2 and 3.

FIG. 2 shows that the emitting means 3 comprise, around the shell 33, a sheath 34 made of an insulating material, except for the upper face 330 of the shell, which is entirely free of insulating material.

Thus, the second electrical contact zone is provided between all of the emitting means. This portion 160 of the second electrical contact zone is in contact with the insulating growth mask 14.

In the continuity of portion 160, the second electrical contact zone completely surrounds the emitting means 3. The portion 161 of the electrical contact is therefore insulating from the peripheral portion of the means 3 by the insulating sheath 34, but it is directly in contact with the upper face 330 of the shell 33.

Finally, also in the extension of portion 160, the second electrical contact zone 16 is provided on the periphery of the emitting means 2 and in direct contact with the shell 23. However, this portion 162 of the second contact zone extends only over a height h of the emitting means 2, so that it does not extend beyond the core 20, in the axial direction of the core, or beyond the peripheral region 220 of the active zone 22.

Owing to this particular structure of the second electrical contact zone 16, when a voltage differential is applied between the first and second electrical contact zones 15 and 16, the emitting means 2 will generate photons with an emission wavelength $\lambda 1$, while the emitting means 3 will emit photons with a wavelength $\lambda 2$.

Thus, the sensation of light that will be perceived by a human eye will result from the combination of wavelengths $\lambda 1$ and $\lambda 2$.

In practice, the macroscopic spectrum of the optoelectronic device according to the invention is determined by the ratio of the number of emitting means of the type of means 2 over the number of emitting means of the type of means 3.

Thus, by modifying this ratio, it is possible also to modify the macroscopic spectrum of the optoelectronic device.

It is therefore by choosing the structure of the second contact zone that the macroscopic spectrum of the optoelectronic device can also be adapted.

A method for obtaining the optoelectronic device shown in FIG. 2 will now be described in reference to FIGS. 3a to 3h.

FIG. 3a shows a first step of this method in which a growth mask is produced on a substrate.

Thus, a layer made of an electrically insulating material is deposited on substrate 11, in order to prevent short-circuits between the electrical contact zone of type p, which will subsequently be formed and substrate 11.

The substrate can be a strongly n-doped silicon substrate and have a thickness of 400 µm.

This layer can in particular be made of $Si_xN_yO_z$ and, for example $SiO_2$ or SiN.

An etching mask is then applied on this insulating material layer. This etching mask can be configured by conventional nanoimprint or lithography techniques.

An etching step is then performed, which makes it possible to obtain the insulating growth mask 14 shown in FIG. 3a. This growth mask is characterized by zones 140, without any insulating material.

FIG. 3b shows a step of localized growth of the core 20, 30 of the nanowires that will form the emitting means 2, 3.

The growth is produced at zones 140, according to conventional techniques, preferably non-catalyzed, such as MOCVD, MBE or HVPE (Hybrid Vapor Phase Epitaxy).

These cores can in particular be made of n-type gallium nitride.

According to a preferred means of the invention, the growth is produced by MOCVD with a low ratio V/III and under a silane flow and with nitrogen as the vector gas under high pressure (close to atmospheric pressure).

They have good electrical continuity with the silicon substrate 11 on which they are epitaxially grown.

In an alternative, a fine layer of Ti, Pt, W, Al, B, SiC, SiN, AlN, Th and $Mg_3N_2$ can be inserted between the substrate 11 and the cores 20 and 30.

It makes it possible to protect the substrate 11 from any gallium attacks. It also provides a good interface for the growth of nanowires.

In this case, the layer must be fine enough for the electrical continuity between the nanowire cores and the substrate not to be modified.

FIG. 3c shows another step of the method in which the growth of the active zone and of the nanowire shell is produced.

During this step, the active zone 21, 31, for example consisting of a relatively thick layer of InGaN or quantum wells made of InGaN/GaN, is radially deposited.

According to the preferred growth method, the growth of quantum wells is performed by increasing the V/III ratio and by reducing the working pressure, while keeping the silane flow or not, and with nitrogen as the vector gas.

The shell 23, 33 is then produced around the active zone. The shell is made of p-type GaN (or InGaN).

According to the preferred growth method, the p doping is performed with a high V/III ratio, under low pressure, optionally with a silane flow and with hydrogen as a vector gas.

An LED with a pn junction is thus formed.

In addition, the conditions for growth of the quantum wells of the active zones can be modified in order to change the diffusion of the species along the walls of the core and thus choose to promote the incorporation of indium in the axial or radial wells of the active zone. Indeed, the inventors have noted that the incorporation of indium could be promoted in both types of wells, after starting with the hypothesis that only the axial quantum wells were concerned.

This will make it possible to better differentiate the wavelengths $\lambda 1$ and $\lambda 2$ associated with the quantum wells.

Thus, at the end of this step, the radial quantum wells and the axial quantum wells will have a different emission wavelength.

FIG. 3d shows a step of depositing a layer 17 of an electrically insulating material.

This material can, for example, consist of a polymer or of $SiO_2$.

This layer 17 is then etched by a conventional lithography technique in order to maintain a sheath 34 around the emitting means 3, as shown in FIG. 3e.

FIGS. 3f and 3g show the step of formation of the electrical contact zone on the emitting means 2 and 3.

In a first step, shown in FIG. 3f, a layer 18 made of a conductive material is formed over the entire surface of the growth mask 14 and therefore around the emitting means 2 and 3.

The conductive material is semi-transparent so as to enable the light to be extracted from the emitting means 2 and 3.

Thus, this layer 18 can, for example, be in the form of a fine metal layer (Ni/Au, Pd/Au or Pt/Au) or an ITO (Indium Tin Oxide) layer.

In a second step, the layer 18 is etched in the upper portion of the emitting means 2. This etching can be performed during a conventional lithography step.

Thus, at the end of these two steps, the contact zone 16 is produced. It is a p-type electrical contact.

As explained in reference to FIG. 2, this second contact zone comprises portions 160 in contact with the mask 14, a portion 161 completely surrounding the emitting means 3 and a portion 162 that extends only over the height h of the emitting means 2, so that the electrical contact zone does not extend beyond the core 20 of the emitting means 2.

Thus, the electrical contact zone 16 forms a so-called peripheral contact on the emitting means 2, by portion 162, and a so-called planar contact on the emitting means 3, by portion 161.

FIG. 3h shows a final step of the method in which another electrical contact zone 15 is produced on the substrate, on the side opposite the emitting means 2 and 3.

This second electrical contact zone can be obtained by depositing a metal layer, for example of Ni/Au.

As indicated above, an optoelectronic device will comprise a plurality of emitting means 2, 3.

Two electrical connection diagram types can then be envisaged.

The different emitting means can be connected individually to one another in series.

FIG. 4 shows another type of connection diagram, in which an optoelectronic device consists of nine different portions: portions 40 to 44 include only emitting means of the type of means 2, i.e. nanowires for which the electrical contact zone 16 forms a peripheral contact and portions 45 to 48, which include exclusively emitting means of the type of means 3, i.e. nanowires comprising a planar electrical contact.

Inside each portion, the emitting means are electrically connected in parallel and the different portions are also connected to one another in parallel.

Thus, for two adjacent portions, the electrical contact of the second electrical contact zone is produced at the different regions of the active zone.

FIG. 5 is an explanatory diagram of a first alternative embodiment of an optoelectronic device according to the invention.

In this alternative of the optoelectronic device shown in FIG. 2, all of the emitting means can generate photons with an emission wavelength λ1 or photons with a wavelength λ2.

Thus, the optoelectronic device includes a plurality of emitting means 5 each including a nanowire 1, as shown in FIG. 1. The nanowires are obtained by growth from the substrate 11, in which a first electrical contact zone 15 is formed on the face of the substrate 11, opposite the nanowire 1.

The emitting means 5 are distinguished from emitting means 2 or 3 by the structure of the second electrical contact zone.

In practice, this second electrical contact zone 51 is made of two portions 510 and 511.

The first portion 510 forms a peripheral electrical contact around the nanowires 1, of the type produced for the emitting means 2.

Thus, this portion 510 is in contact with the insulating mask 14, and it is directly in contact with the peripheral portion of the shell 13. In other words, portion 510 forms an electrical contact only over a height h of the nanowire 1, so that it does not extend beyond the core 10 of the nanowire 1.

In addition, a layer of insulating material 52 is present around the nanowires 1, except for the upper face 130 of the shell 13, which is entirely free of insulating material.

The second portion 511 covers all of the emitting means 5. It is therefore insulated from the peripheral portion of the nanowire 1 by the insulating layer 52, but it is directly in electrical contact with the upper face 130 of the shell. This portion 511 therefore produces a similar electrical contact to that present on the emitting means 3.

Thus, the same group of emitting means 5 may generate photons with a wavelength λ1, by applying a suitable voltage differential between the electrical contact zones 15 and 510, or photons with an emission wavelength λ2, when a suitable voltage differential is applied between the electrical contact zones 15 and 511. The same group of emitting means 5 can therefore emit either only photons with an emission wavelength λ1, or only photons with an emission wavelength λ2.

An optoelectronic device according to the invention will thus be obtained by associating at least two groups of emitting means 5, which two groups are electrically independent.

Such an example of an optoelectronic device according to the invention is shown in FIG. 6.

This optoelectronic device thus includes two groups 60 and 61 of emitting means 5, which two groups are electrically independent. Of course, the optoelectronic device can comprise more than two groups of emitting means.

The electrical power supply of the first group 60 is controlled so that a voltage differential is applied between the first electrical contact zone 15 and the portion 510 of the second contact 51. Thus, the emitting means 5 of the group 60 will generate photons with an emission wavelength λ1.

By contrast, the electrical power supply of the emitting means 5 of the second group 61 is controlled so that a voltage differential is applied between the first electrical contact zone and the portion 511 of the second electrical contact zone 51. The emitting means 5 of the second group 61 will therefore emit photons with a wavelength λ2.

The macroscopic spectrum of the optoelectronic device obtained can be controlled by modulating the operating voltages applied to each of the groups 60 and 61. Indeed, the intensity of the light emitted by each group is dependent on the current that passes through the emitting means and therefore the voltage at their terminals.

This macroscopic spectrum is also dependent on the number of emitting means present in each group.

Finally, if the number of emitting means present in each group is different, the macroscopic spectrum can also be modified by inverting the connection diagram, so that the first group 60 emits photons with a wavelength λ2 and the second group 61 emits photons with a wavelength λ1.

Reference will now be made to FIG. 7, which shows a nanowire 7 also having a core/shell structure.

The core 70 of the nanowire consists of an actual nanowire, which has been obtained by epitaxis perpendicular to the growth substrate 11.

In this example, the core 70 has three crystallographic planes: the m-planes over the periphery 700 of the core, the c-planes at the upper portion 701 of the core, opposite the substrate, as well as the r-planes, over the frusto-conical portion 702 of the core 70, located between the periphery 700 and the upper portion 701. This particular form of the core 70 can be obtained under particular growth conditions. In this regard, reference can be made to the article of Bergbauer W. et al. mentioned above.

Reference 72 designates the active zone of the nanowire that is produced around the core 70.

This active zone comprises three families of quantum wells, according to the crystallographic plane on which they are epitaxially grown. These three families are distributed among three different regions: a peripheral region 720, in which the quantum wells are radial, a second region 721, in which the quantum wells are axial and a third region 722, in which the quantum wells are inclined according to r-planes.

FIG. 8 diagrammatically shows an optoelectronic device according to the invention that comprises three light-emitting means of the type of the nanowire 7 shown in FIG. 7.

These emitting means 7a, 7b and 7c differ from one another by the structure of their second contact zone, with the first contact zone 15 being produced on the face of the substrate 11 opposite the nanowire.

Of course, an optoelectronic device according to the invention will comprise, in practice, more than three emitting means of the type of means 7a, 7b and 7c.

Thus, each of the emitting means 7a to 7c has an active zone comprising three regions corresponding to quantum wells associated with different emission wavelengths. This active zone comprises a peripheral region 720a to 720c capable of generating photons with an emission wavelength λ1, an upper region 721a to 721c capable of generating photons with an emission wavelength λ2 and an intermediate region 722a to 722c capable of generating photons with an emission wavelength λ3.

The second electrical contact zone 17 will now be described in greater detail.

FIG. 8 shows that the emitting means 7b comprise, in the peripheral portion 730b of the shell 73b, a sheath 74b of insulating material.

In addition, the emitting means 7c comprise, around the shell 73c, a sheath 74c of insulating material, except for the upper face 731c of the shell 73c, which is entirely free of insulating material.

The second electrical contact zone 17 is provided on the emitting means 7a to 7c, and it is therefore in contact with the mask 14 between these means.

Thus, the second electrical contact zone completely surrounds the emitting means 7c. It is therefore electrically insulated from the means 7c, except for the upper face 731c of the emitting means, with which it is directly in contact.

In addition, this second electrical contact zone is provided on the periphery of the peripheral portion 730a of the shell 73a and directly in electrical contact with same. However, the second electrical contact zone does not extend around the upper portion of the means 7a, defined by the intermediate portion 732a and the upper portion 731a of the shell 73a, or beyond the peripheral region 720a of the active zone.

With regard to the emitting means 7b, the second electrical contact zone extends around the insulating sheath 74b. It also extends partially over the intermediate portion 732b of the shell 73b. In other words, the second contact zone is provided on the periphery of the emitting means 7b, over a height h1, so that the upper portion of the emitting means is partially exposed. In this case, the upper portion of means 7b is portion 732b, which ends with the upper face 731b of the shell 73b.

Owing to this particular structure of the second electrical contact zone 17, a voltage differential between the first and second contact zones 15 and 17 causes the generation of photons with an emission wavelength λ1 by the emitting means 7a, with an emission wavelength λ3 by the emitting means 7b and with a wavelength λ2 by the emitting means 7c.

Thus, the sensation of light that will be perceived by a human eye will come from the combination of wavelengths λ1, λ2 and λ3.

The light emitted by the device according to FIG. 8 will be of higher quality than that emitted by the device according to FIG. 1, in terms of color rendering index (CRI) and correlated color temperature (CCT).

As explained in reference to FIG. 2, the macroscopic spectrum of this optoelectronic device is determined by the number of emitting means corresponding to each of types 7a, 7b and 7c.

A method for obtaining the optoelectronic device shown in FIG. 8 is deduced simply from that described in reference to FIGS. 3a to 3h.

Reference will now be made to FIG. 9, which shows an alternative embodiment of the optoelectronic device according to FIG. 8. This alternative is similar to that shown in FIG. 5.

Indeed, FIG. 9 shows a group of emitting means that each comprise the three types of electrical contact described for means 7a to 7c, with regard to the second electrical contact zone 81.

The first electrical contact zone 15 is produced on the substrate 11, on the side opposite the emitting means 8.

Each of the emitting means 8 comprises a nanowire 7, as shown in FIG. 7, and which will not be described in detail again.

The second electrical contact zone 81 consists of three portions 810, 811 and 812.

The first portion 810 forms an electrical contact around the peripheral portion 730 of the shell 73 of the nanowires, as explained for the emitting means 7a.

A layer of insulating material 82 is present on the first portion 810 of the second electrical contact zone, except for the intermediate portion 732 of the upper face 731 of the shell 73. This layer 82 therefore creates an insulating sheath around the nanowires 7, similar to the sheath 74b described for the emitting means 7b.

The second portion 811 of the second electrical contact zone 81 extends over this layer 82 and it also extends partially over the intermediate portion 732 of the shell 73.

In other words, the upper portion of the nanowires 7, formed by the intermediate portion 732 and the upper face 731 of the shell, is partially free of any electrical contact.

Thus, this second portion 811 forms an electrical contact similar to that described for the emitting means 7b.

Finally, a second layer 83 of insulating material is deposited on the second portion 811. Thus, only the upper face 731 of the shell 73 of the nanowires 7 is free of insulating material.

The third portion 812 of the second electrical contact zone is deposited on the layer of insulating material 83. It is therefore directly in electrical contact with the upper face 731 of the shell of the nanowires 7.

Thus, each of the emitting means 8 comprises the three types of electrical contact of the second electrical contact zone that were described for means 7a, 7b and 7c.

In practice, the three emitting means 8 shown in FIG. 9 can therefore emit photons with an emission wavelength λ1, if a voltage differential is applied between the first electrical contact zone 15 and the first portion 810 of the second electrical contact zone 81. A voltage differential applied between contact zones 15 and 811 will make it possible to generate photons with an emission wavelength λ3. Finally, a voltage differential applied between the electrical contact zones 15 and 812 will make it possible to generate photons with an emission wavelength λ2.

As explained in reference to FIG. 6, an optoelectronic device according to the invention can be formed by a plurality of groups of emitting means 8, in which said groups are electrically independent.

The observations made for the device shown in FIG. 6 are also valid for the device shown in FIG. 9.

FIG. 10 shows another alternative of the invention in which the growth of n-doped GaN nanowires is produced on an n-doped GaN substrate 18.

In this case, the substrate 11 is not necessarily electrically conductive and can, for example, be made of sapphire.

The second electrical contact zone 16, of type p, is produced as described above.

By contrast, the first electrical contact zone 19, of type n, is produced on the substrate 18. This requires a preliminary step of etching the growth mask 14 and the first electrical contact zone 16.

Reference will now be made to FIG. 11, which shows an alternative of the device shown in FIG. 10, in which an electrical connection in series of the emitting means is provided.

The device includes two emitting means 2 and 3 between which a nanowire 9 of which the core 90 is optically inactive, because the current does not pass through the pn junction, is arranged.

The second electrical contact zone 16 forms a peripheral contact on the emitting means 2, by portion 162, and a planar contact on the emitting means 3, by portion 161.

Between these two portions 161 and 162, the second zone 16 comprises a portion 160 in contact with the growth mask, which extends by a portion 163 that comes into contact with the core 90 of the nanowire 9.

FIG. 11 shows that the upper portion of the active portion 92 and the shell 93 of the nanowire 9 has been removed and that the insulator 34 is present not only around the emitting means 3 but also around the core 90 of the nanowire in this upper portion.

By contrast, the upper face 900 of the core 90 is in direct contact with the portion 163 of the second electrical contact zone. In this way, an electrical connection is established between the p-type contact zone 162 of the emitting means 2 and the n-type contact zone of the emitting means 3. Indeed, the core 90 of the nanowire 9 is connected to the core 30 of the emitting means 3 by the substrate 18. This ensures the series arrangement of the emitting means 2 and 3.

This alternative of the device has the advantage of increasing the operating voltage and of bringing it closer to the voltage of the sector. The device is thus more efficient.

The reference signs inserted after the technical features appearing in the claims are intended solely to make it easier to understand these features and cannot limit the scope of same.

The invention claimed is:

1. Optoelectronic device including light-emitting means in the form of nanowires (1, 7) having a core/shell-type structure and produced on a substrate (11), in which said nanowires comprise an active zone (12, 72) including at least two types of quantum wells associated with different emission wavelengths and distributed among at least two different regions (120, 121; 720, 721, 722) of said active zone, a first region (120, 720) of the active zone (12, 72) of the nanowires (1, 7) being a peripheral portion at least partially surrounding the core (10, 70) of the nanowires and comprising radial quantum wells and a second region (121, 721) of the active zone being an upper portion located on the end of the core of the nanowire, with axial quantum wells, in which the device also includes a first electrical contact zone (15) on the substrate and a second electrical contact zone (16, 51; 17, 81) on the emitting means, in which said second zone is arranged so that, as the emitting means are distributed according to at least two groups, the electrical contact is achieved for each of said at least two groups at a different region of the active zone, and the electrical power supply is controlled so as to obtain the emission of a multi-wavelength light.

2. Optoelectronic device according to claim 1, in which the active zone (72) comprises a third region (722), located between the first and second regions.

3. Optoelectronic device according to claim 1, including a plurality of portions (40 to 48) electrically connected in parallel and inside of which the emitting means are connected in parallel, with the electrical contact of the second electrical contact zone being produced in a region different from the active zone, for two adjacent portions.

4. Optoelectronic device according to claim 1, in which the active zone of the nanowires is made of InGaN/GaN.

5. Optoelectronic device including light-emitting means in the form of nanowires (1, 7) having a core/shell-type structure and produced on a substrate (11), in which said nanowires comprises an active zone (12, 72) including at least two types of quantum wells associated with different emission wavelengths and distributed among at least two different regions (12, 121; 720, 721, 722) of said active zone, in which the device also includes a first electrical contact zone (15) on the substrate and a second electrical contact zone (16, 51; 17, 81) on the emitting means, in which said second zone is arranged so that, as the emitting means are distributed according to at least two groups, the electrical contact is achieved for each of said at least two groups at a different region of the active zone, and the electrical power supply is controlled so as to obtain the emission of a multi-wavelength light, wherein the active zone of the emitting means comprises two distinct regions, the emitting means (3) of the second group are surrounded by an electrically insulating material (34), with the exception of an upper face (330) opposite the substrate, and the second electrical contact zone completely surrounds the emitting means of the second group and is provided on the periphery of the emitting means (2) of the first group and in direct contact with the emitting means of the first group, over a height h corresponding to the first region of the active zone, so that the upper portion of these emitting means (2) of the first group is exposed.

6. Optoelectronic device according to claim 5, in which the emitting means comprise an active zone with a third region, the emitting means (7b) of a third group are surrounded by an electrically insulating material over the height h, and the second electrical contact zone is provided on the periphery of the emitting means (7b) of the third group, over a height $h_1$, greater than h, so that the upper portion of the emitting means of the third group is partially exposed.

7. Optoelectronic device according to claim 1, in which, for at least some of the emitting means, the second electrical contact zone is arranged so that the electrical contact is produced in at least two regions of the active zone.

8. Optoelectronic device according to claim 7, in which the emitting means are distributed among at least two electrically independent groups (60, 61), and the electrical power supply is controlled so that, for each of said at least two groups, different regions of the active zone are supplied with power.

9. Optoelectronic device according to claim 5, in which, for at least some of the emitting means, the second electrical contact zone is arranged so that the electrical contact is produced in at least two regions of the active zone.

10. Optoelectronic device according to claim 5, in which the active zone of the nanowires is made of inGaN/GaN.

\* \* \* \* \*